United States Patent
Hall et al.

(10) Patent No.: US 6,372,648 B1
(45) Date of Patent: Apr. 16, 2002

(54) INTEGRATED CIRCUIT PLANARIZATION METHOD

(75) Inventors: Lindsey H. Hall, Phoenix, AZ (US); Jennifer A. Sees, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/442,181

(22) Filed: Nov. 16, 1999

Related U.S. Application Data

(60) Provisional application No. 60/108,620, filed on Nov. 16, 1998.

(51) Int. Cl.$^7$ .............................................. H01L 21/302

(52) U.S. Cl. ........................ 438/692; 438/633; 438/626

(58) Field of Search ................................. 438/626, 633, 438/692

(56) References Cited

U.S. PATENT DOCUMENTS

| | | | | | |
|---|---|---|---|---|---|
| 5,391,258 | A | * | 2/1995 | Brancaleoni et al. | 156/636 |
| 5,584,146 | A | * | 12/1996 | Shamouillan et al. | 51/293 |
| 5,861,055 | A | * | 1/1999 | Allman et al. | 106/3 |
| 9,190,240 | | * | 2/2001 | Kinoshita et al. | 451/56 |
| 6,218,305 | B1 | * | 4/2001 | Hosali et al. | 438/691 |
| 6,241,581 | B1 | * | 6/2001 | Miyashita | 451/41 |

* cited by examiner

*Primary Examiner*—John F. Niebling
*Assistant Examiner*—Jennifer M. Kennedy
(74) *Attorney, Agent, or Firm*—Carlton H. Hoel; W. James Brady; Frederick J. Telecky, Jr.

(57) ABSTRACT

Chemical mechanical polishing slurry with functionalized silica abrasive particles, the functionalization permits high pH slurry without rapid degradation of silica particles and also permits the modification of surface properties of abrasive particles to modify slurry behavior. One example of modified behavior would be to enhance selectivity by controlling particle interaction with different surfaces on the wafer.

5 Claims, 3 Drawing Sheets

INTEGRATED CIRCUIT PLANARIZATION METHOD

RELATED APPLICATIONS

This application claims priority under 35 USC § 119(e)(1) of provisional application No. 60/108,620 filed Nov. 16, 1998.

BACKGROUND OF THE INVENTION

The invention relates to electronic semiconductor devices, and, more particularly, to planarization methods useful in device fabrication.

The manufacturing process flow for semiconductor devices includes planarization steps which are designed to selectively remove surface features which protrude from the wafer surface. Such features may be a consequence of blanket depositions of dielectric or metal films onto wafers with etched surface patterns or of localized depositions of materials in areas defined by photolithography and etching.

A desired property of the planarization process is a control of the selectivity of the removal rate with regard to different materials, such as grown silicon dioxide, vapor phase deposited polysilicon, silicon nitride, borophospho silicate glass, and metals like aluminum, titanium, tungsten, copper, et cetera.

Chemical mechanical polishing (CMP) is a process that combines chemical etching with mechanical abrasion by using a polishing pad with a polishing slurry which contains suspended abrasive particles; see heuristic FIG. 4. The chemical aspects of the removal are controlled by the composition of the polishing slurry. For example, etch removal of $SiO_2$ can be achieved by hydroxide or bifluoride additions resulting in high pH values.

The mechanical component of the removal process is controlled by the addition of abrasive powders. $SiO_2$, $Al_2O_3$ and CeO powders are examples for such materials.

Besides slurry composition and feed rate, type and particle size of the abrasive additive, CMP process parameters include type and hardness of the polishing pad, applied pressure and plate rotational speed.

For a detailed presentation of the CMP process reference is made to Beyer et al., U.S. Pat. No. 4,944,836 and to the review article by Ali et al, Chemical-Mechanical Polishing of Interlayer Dielectric: A Review, Solid State Technology, October 1994, p.63. More recent activities are reflected in a publication by Wijekoon et al., Tungsten CMP Process Developed, Solid State Technology, April 1998, p.53–56, describing the development of a commercial CMP process for the formation of tungsten plugs.

The composition of slurries is formulated for the achievement of specific process objectives and additives are in use to enhance process characteristics. In one specific example, Farkas et al., U.S. Pat. No. 5,614,444 introduced a family of additives that enhance the selectivity in metal CMP. Those additives have both polar and apolar components, the polar component interacts with functional groups at the oxide surface and forms an interacted apolar passivation layer. The additives thus block or replace the surface functional groups so that the interaction between the wafer oxide surface and the slurry is reduced and the corrosion process impeded. The metal surface remains unaltered by the additive and the result is that process selectivity for the metal oxide removal rate is enhanced.

During the manufacture of silicon integrated circuits, CMP finds extensive applications in the Shallow Trench Isolation (STI) process to planarize uneven surfaces. Silica powder with tight particle size specifications is preferably selected as abrasive component for this CMP process because it produces smooth, scratch free surfaces. The STI process requires removal rate selectivity for nitride and oxide films. This selectivity is controlled by the pH value; increasing the pH value enhances the nitride/oxide selectivity. Raising the pH value by adding a hydroxide like KOH to the CMP slurry has the undesired side effect of accelerating the decomposition of silica particles. Ongoing particle size reduction is reflected in continually changing removal characteristics and in a short slurry lifetime.

The functionalization of a silica surface has been demonstrated in the past. For example, organic reactions applied to chromatography include: Bayer et al. Characterization of chemically modified silica gels by . . . and 13C Cross-Polarization and Magic Angle Spinning Nuclear Magnetic Resonance, J. of Chromatography, 264 (1983) 197–213, reacted several organo-silicon compounds in toluene at 80 C under argon with silica and studied the character and the strength of the chemical bonds. Wirth et al., Horizontal Polymerization of Mixed Trifunctional Silanes on Silica: A Potential Chromatographic Stationary Phase, Anal. Chem. 1992, 64 2783–2786, worked with nearly solid layers of alkyl chains with Cl3Si-R functionality. Some layers survived boiling in concentrated nitric acid for 25 minutes. Kirkland et al. Reversed Phase HPLC and Retention Characteristics of Conformationally Different Bonded Alkyl Stationary Phases, J. of Chromatographic Science, Vol.32, November 1994, p. 473–479, showed that some sterically protected dimethyl-C18 films show stability against hydrolysis in solutions with pH values as high as 9. Karch et al. "Preparation and Properties of Reversed Phases", J. of Chromatography, 122, (1976) 3–16, studied reaction conditions to control the length of the bonded molecules and the effect of the length on absorption properties.

SUMMARY OF THE INVENTION

The present invention provides the use of functionalized oxide (e.g., silica, alumina, CeO) particles as abrasive particles in chemical mechanical polishing.

This has the advantages including abrasive particles which do not readily degrade in high pH slurries. In addition, the surface properties can be modified as needed to enhance selectivity by controlling, for example, the attraction/repulsion forces between the abrasive particles and the surface of interest.

BRIEF DESCRIPTION OF THE DRAWINGS

The drawings are heuristic for clarity.

DESCRIPTION OF THE PREFERRED EMBODIMENTS

Overview

The preferred embodiments modify the surfaces of particles of oxides (e.g., $SiO_2$, $Al_2O_3$, CeO) used as an abrasive in a chemical mechanical polishing (CMP) slurries with high pH by attaching functional groups such as $C_nH_{2n+1}$ to deter degradation.

First preferred embodiment

Figure 1A:
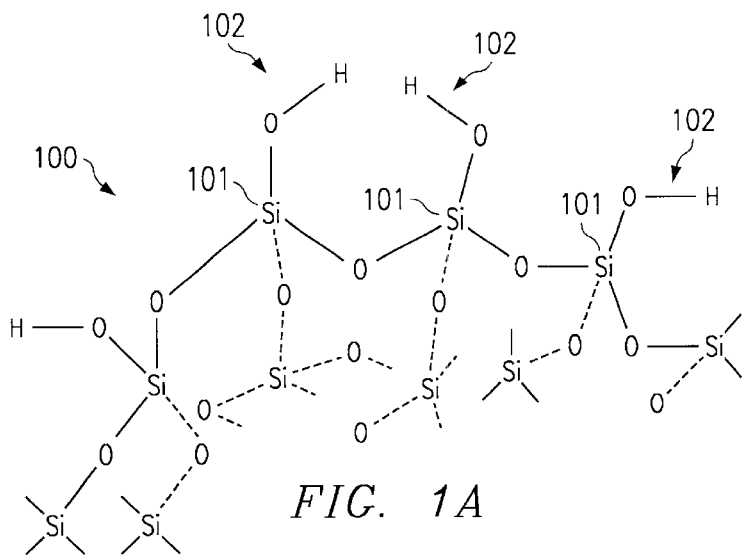
FIGS. 1A–1C schematically illustrate a first preferred embodiment functionalization of silica particles.
Figure 1B:
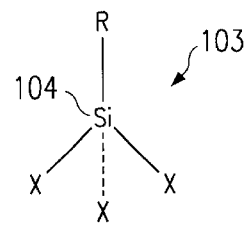
Figure 1C:
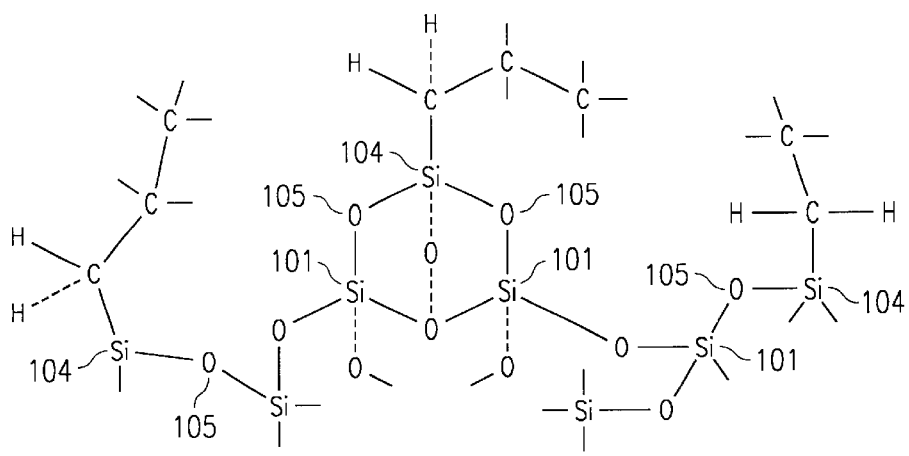

FIGS. 1A–1C schematically illustrate a first preferred embodiment surface modification (adding functional groups) to silica particles by reaction with silane derivatives.

FIG. 1A schematically illustrates a portion of silica particle 100 with surface hydroxyl groups 102 bonded to silicon surface atom 101 (i.e., silanol groups). For CMP, particles 100 would have diameters in the range of about 0.5 to 2.0 µm.

FIG. 1B illustrates silane derivative 103, consisting of a silicon atom 104 with one organic functional group R and three groups X. The organic functional group could be aliphatic hydrocarbon, amine, ether, nitrile, aromatic hydrocarbon, or many other groups. X can be halogen, hydroxyl, ether, hydrocarbon, or other groups as appropriate.

FIG. 1C depicts the result of a reaction between silica particle 100 and silane derivative 103. The resulting compound has the silane silicon atoms 104 now bonded to the silica surface via the oxygen atoms 105 from the hydroxyl groups 102. The other reaction product is HX.

The reaction, for example, could be hydrolysis in anhydrous n-hexadecane with silica surface-adsorbed water as the reagent water. R could be $C_nH_{2n+1}$ with n in the range of 1 to about 20 and X could be Cl; the reaction would take place only on the surface of the silica particles (a "horizontal polymerization"). The reaction yields $C_nH_{2n+1}Si(O—)_3$ groups covering the silica surface as illustrated in FIG. 1C. Thus the silane silicon 104 has three bonds to the silica surface oxygen atoms and one bond to the hydrocarbon. The $C_nH_{2n+1}$ groups provide a hydrocarbon barrier layer and deter attack on the silica by strongly basic slurries (e.g., KOH solution) during CMP. And note that the term bonding throughout means "chemical bonding" of the organic functional groups, contrasted by weaker bonds such as hydrogen bonds or electrostatic attraction or adsorption. These strong bonds provide a larger degree of stability by retarding hydrolysis and other reactions.

A range of polarities and chemical properties can be achieved by changing the functional group. Indeed, a mixture of silane derivatives could be used, such as 40% with R as $C_{18}H_{37}$ and 60% with R as $C_3H_7$; this will yield a surface covered by long chain hydrocarbons interspersed among short chain hydrocarbons.

After the reaction has taken place the functional groups can be further derivitized using standard organic chemical reactions to replace or modify the various functional groups.

Analogous reactions with alumina and CeO particles yield similarly functionalized particles.

After formation of the functionalized silica particles, the particles are dispersed in an aqueous KOH solution to form the CMP slurry.

As described in the following preferred embodiments, it is also possible to utilize difunctional and trifunctional silanes in addition to the monofunctional silane described above and also to cross-link the functional groups.

Second preferred embodiment

Figure 2A:
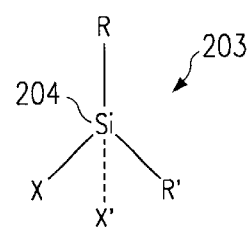
FIGS. 2A–2F schematically show a second preferred embodiment functionalization of silica.

FIGS. 2A–2E depict schematically preferred embodiments derived from silanes with two functional groups. FIG. 2A shows silane 203 with silicon atom 204 bonded to two organic functional groups R and R' and two groups X and X', all groups with a composition as described in the foregoing discussion of FIGS. 1A–1C.

Figure 2B:
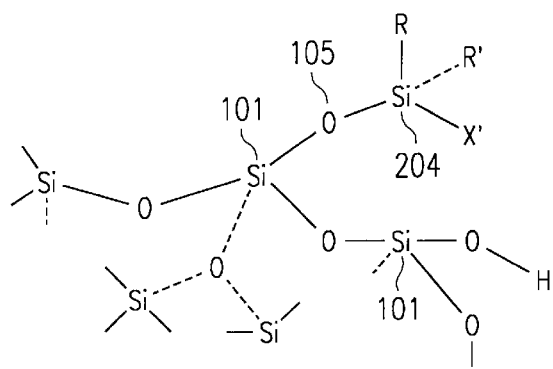

FIG. 2B shows the reaction product of X being substituted by the oxygen atom 105 of the hydroxyl on the silica particle surface: silane 203 is bonded to silica particle surface silicon atom 101 via oxygen atom 105 and group X' still remains on silane 203. This group X' can also react to yield either further bonding to the silica analogous to the first preferred embodiment or bond to something else, such as cross-linking with a group on an adjacent silane.

Figure 2C:
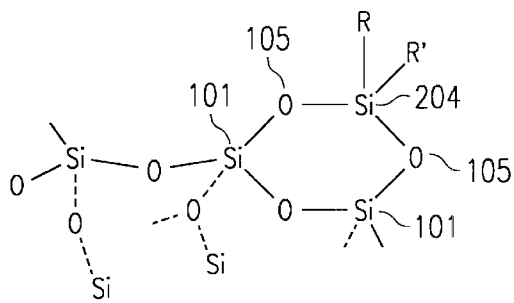

FIG. 2C depicts the results of the X' group replaced by a bond to another oxygen atom 105.

Figure 2D:
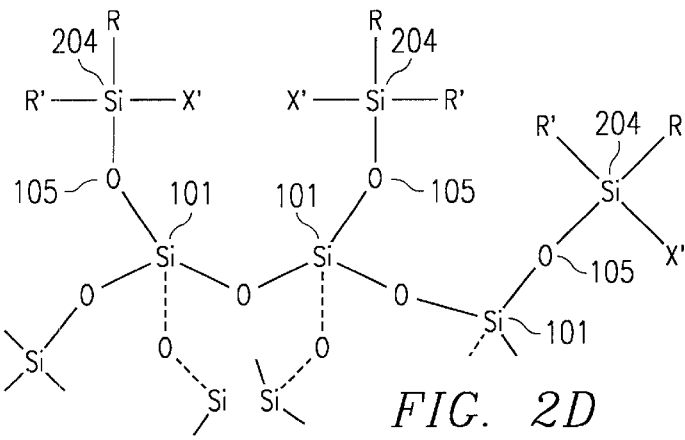
Figure 2E:
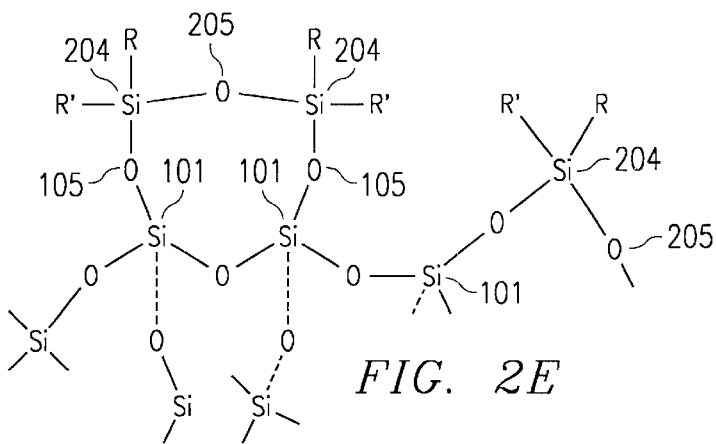

FIG. 2D shows three silanes 203 after reaction to replace the X groups with bonds to the oxygens 105 of the original hydroxyls on the silica particle surface but prior to reaction of the X' groups. FIG. 2E shows a cross-linking of pairs of the silane silicon atoms 204 to each other by replacement of the X' groups by an oxygen atom 205.

Figure 2F:
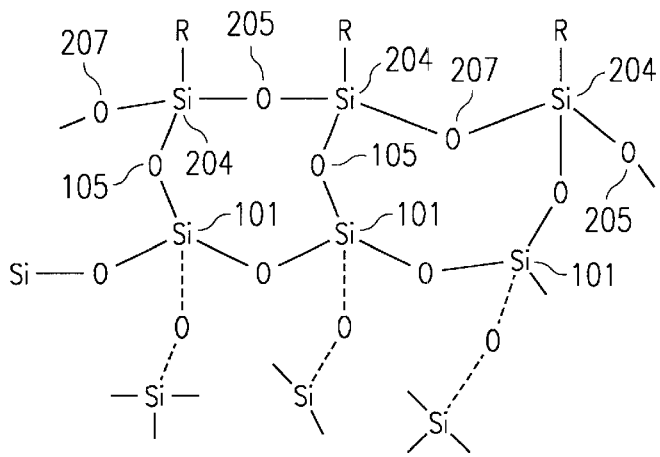

FIG. 2F illustrates the results of a second reaction of replacing adjacent pairs of R' groups with oxygen atoms 207 to extend the cross-linking across the silica surface. Of course, for cross-linking the original silanes could have had a single functional group R with X and two X' groups and cross-linked in a single reaction.

Third preferred embodiment

Figure 3A:
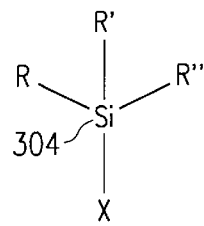
FIGS. 3A–3B schematically illustrate a third preferred embodiment functionalization of silica.

FIG. 3A illustrates a silane with three functional groups R, R', and R" and one X bonded to silicon 304.

Figure 3B:
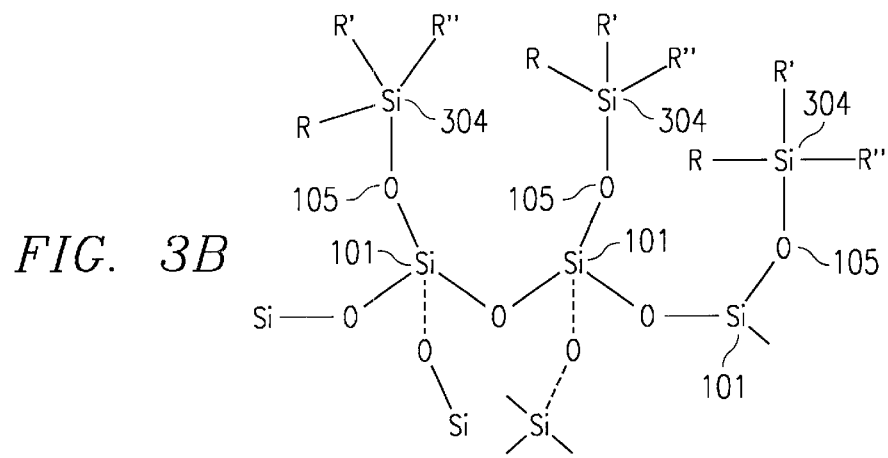
Figure 4:
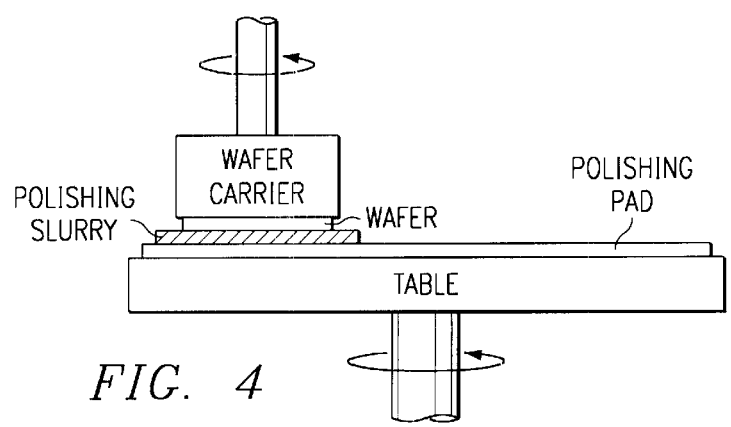
FIG. 4 heuristically shows in cross sectional elevation view a chemical mechanical polishing apparatus.

FIG. 3B shows the results after reaction to replace the bond to the X with a bond to a surface oxygen 105 from an initial hydroxyl group 102 on silica particle 100. In this case the R, R', and R" could also be small groups such as a single F atoms to yield a fluorinated surface.

Experimental results

Two examples of functionalized silica were tested to verify the resistance to degradation in strong KOH. A pH 13.78 solution of KOH was prepared and 3-aminopropyl functionalized silica and octadecyl functionalized silica was placed in this solution. The pH values were monitored to quantify the chemical attack. A reduction of pH indicates that the KOH reacted, i.e. silica was attacked and partially dissolved. The results of this test are presented in Table I. The 3-aminopropyl functionalized silica was slightly attacked while the octadecyl functionalized silica showed no indication of attack.

TABLE 1 pH Changes for Different Groups

|  | initial pH | pH after 1 hr of mixing |
| --- | --- | --- |
| KOH only | 13.78 | 13.78 |
| KOH + silica | 13.78 | 13.66 |
| KOH + 3-amino | 13.78 | 13.74 |
| KOH + octadecyl | 13.78 | 13.78 |

These results indicate that the 3-amino group provides partial protection of the silica while the octadecyl group provided significant protection.

Modifications

The preferred embodiments can be modified in various ways while retaining the features of functionalized silica particles for CMP abrasives.

Other types of bonding to the silica surface are possible in addition to the Si—O—Si—C bonding described above. Such examples are Si—N—C and Si—C bonding. The stability against hydrolysis increases in the order Si—O—C, Si—N—C, Si—C. The focus of the description on Si—O—Si—C bonding is not to be construed as a limitation of the scope of the invention.

What is claimed is:

1. A planarization method, comprising the steps of:
   (a) providing oxide particles in a basic slurry, said particles including surface regions bonded to functional groups, said slurry free of any binding polymer; and
   (b) using the slurry of step (a) to chemo-mechanically polish a substrate.

2. The method of claim 1, wherein:
   (a) said particles are made of material selected from the groups consisting of alumina, silica, and cerium oxide and mixtures thereof.

3. The method of claim 1, wherein:
   (a) said functional groups are selected from the groups consisting of aliphatic hydrocarbon, amine, ether, nitrile, and aromatic hydrocarbon and mixtures thereof.

4. The method of claim 3, wherein:
   (a) said functional group is octadecyl.

5. The method of claim 1, wherein:
   (a) said particles have two or more distinct ones of said functional groups.

* * * * *